US006414615B1

United States Patent
Cheng

(10) Patent No.: US 6,414,615 B1
(45) Date of Patent: Jul. 2, 2002

(54) EXCESS DELAY COMPENSATION IN A DELTA SIGMA MODULATOR ANALOG-TO-DIGITAL CONVERTER

(75) Inventor: William W. Cheng, Redondo Beach, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/532,626

(22) Filed: Mar. 22, 2000

(51) Int. Cl.[7] .............................................. H03M 3/00
(52) U.S. Cl. ...................................... 341/143; 341/144
(58) Field of Search .................................. 341/143, 144, 341/155, 61, 95; 375/220

(56) References Cited

U.S. PATENT DOCUMENTS

| 5,692,020 A | * | 11/1997 | Robbins ..................... 375/350 |
| 5,717,715 A | * | 2/1998 | Claydon et al. ............. 375/220 |
| 5,818,374 A | * | 10/1998 | Tan ............................ 341/143 |
| 6,064,871 A | * | 5/2000 | Leung ......................... 455/323 |
| 6,232,901 B1 | * | 5/2001 | Abbey ......................... 341/143 |

* cited by examiner

Primary Examiner—Peguy JeanPierre
Assistant Examiner—Joseph Lauture
(74) Attorney, Agent, or Firm—Leonard A. Alkov

(57) ABSTRACT

A high-performance delta sigma analog-to-digital converter. The high-performance delta sigma analog-to-digital converter includes a first mechanism for converting an input analog signal to a digital output signal. The first mechanism is characterized by a transfer function that is altered relative to an ideal transfer function. A second mechanism compensates for the alteration in the transfer function via a single additional digital-to-analog converter. In a specific embodiment, the alteration includes an additional pole and an additional zero induced by feedback delays in the first mechanism. The feedback delays include signal dependent jitter delay and feedback digital-to-analog converter cell switching delays. The second mechanism includes an additional latch that compensates for the signal dependent jitter delay. The first mechanism includes a resonator and a quantizer. The second mechanism includes a feedback path from an output of the quantizer to the resonator. The feedback path includes a first latch positioned between an output of the quantizer and the additional digital-to-analog converter. The additional latch is positioned at an output of the first latch and eliminates signal dependent jitter delay in the analog-to-digital converter. The additional feedback digital-to-analog converter is a non-return-to-zero digital-to-analog converter, an output of which is connected to the resonator.

31 Claims, 9 Drawing Sheets

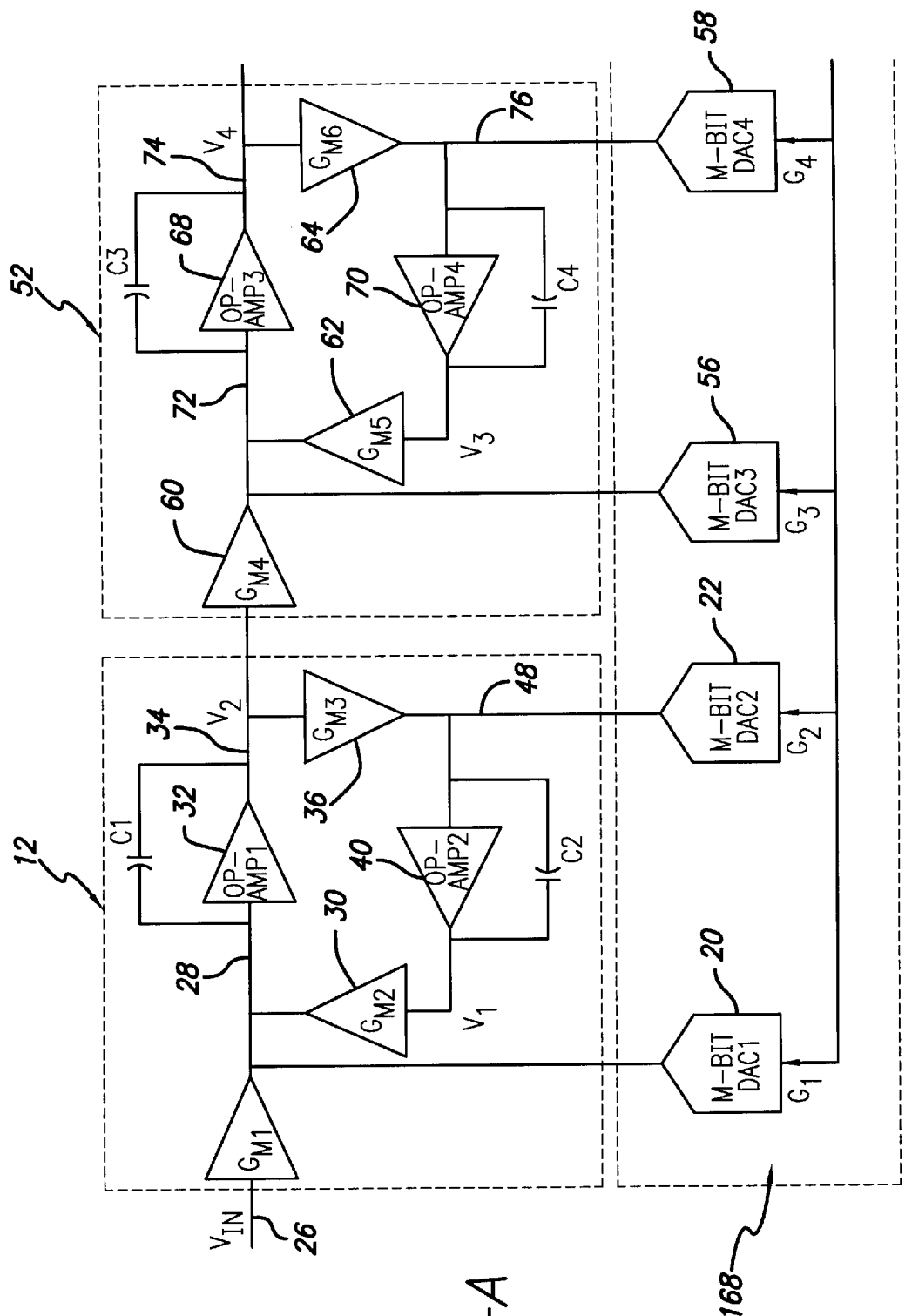
FIG. 7-A

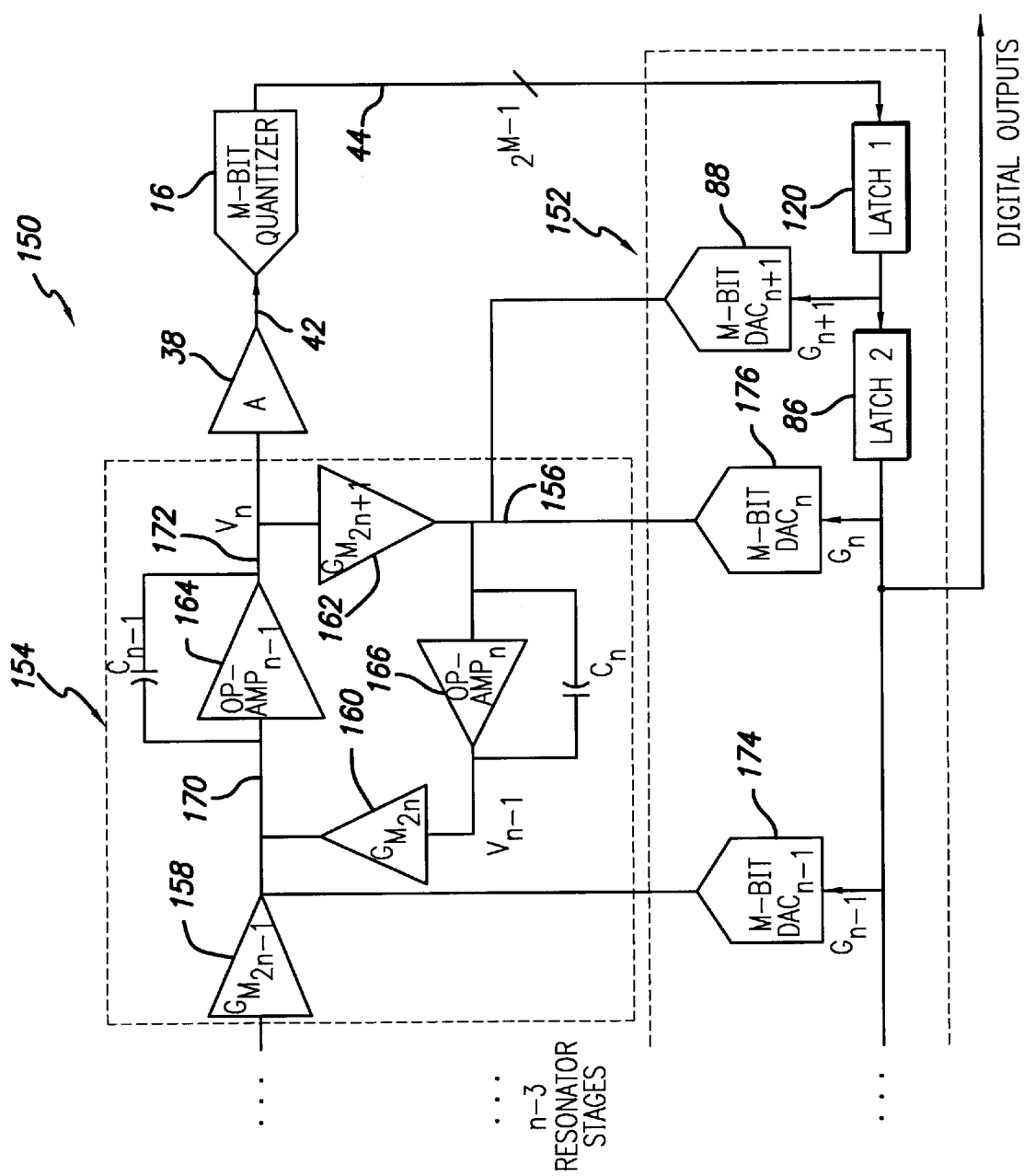
FIG. 7-B

EXCESS DELAY COMPENSATION IN A DELTA SIGMA MODULATOR ANALOG-TO-DIGITAL CONVERTER

This invention was made with support under Government Contract N66001-97-C-8004 with the Department of the Navy. The government has certain rights to this invention.

BACKGROUND OF THE INVENTION

1. Field of Invention

This invention relates to analog-to-digital converters. Specifically, the present invention relates to high-performance delta sigma analog-to-digital converters.

2. Description of the Related Art

Analog-to-digital converters (ADC's) are employed in a variety of demanding applications including computer modems, wireless telephones, and satellite receiver systems. Such applications demand cost-effective ADC's that can efficiently convert an analog input signal to digital output signal over a wide range of frequencies and signal magnitudes with minimal noise and distortion.

An ADC typically converts an analog signal to a digital signal by sampling the analog signal at predetermined sampling intervals and generating a sequence of binary numbers via a quantizer in response thereto. The sequence of binary numbers is a digital signal representation of the sampled analog signal.

The length of a binary number assigned to a given sampled value of the analog signal corresponds to the number of quantizer bits and is limited. Consequently, a digital sample will not always precisely represent the corresponding analog sample. The difference between a digital sample and the corresponding analog sample represents quantization error.

The sampling frequency of the ADC is the inverse of the sampling interval. The resolution of the ADC is directly related to the number of binary bits assigned to each sampled value and inversely related to quantization error. The minimum difference between successive values that may be represented by the quantizer is the quantization step size. Quantization error results in quantization noise in the output digital signal, which is also called granular noise.

When an analog sample is too large to be accurately digitally represented by to the quantizer (given the fixed number of quantizer bits), clipping occurs, resulting in distortion called overload noise. To reduce overload noise, the dynamic range of an ADC is often increased. The dynamic range of an ADC is the range of values of an analog input signal over which the ADC can accurately represent the analog signal. For a conventional Nyquist ADC, the dynamic range is difference between maximum and minimum values represented by the quantizer. High-quality ADC's often have high signal-to-noise ratios (SNR's) and high dynamic ranges.

The sampling frequency of an ADC is usually chosen to be greater than twice the maximum frequency of the analog input signal, which is known as the Nyquist rate. In a typical Nyquist ADC, the input analog signal is sampled at approximately the Nyquist rate. To achieve effective SNR'S, the resolution of the ADC is increased.

Unfortunately, adding additional resolution required to obtain sufficient SNR's is often costly.

Alternatively, oversampling ADC's are employed. An oversampling ADC samples an analog signal at sufficiently high rates to reduce quantizer resolution requirements. By oversampling, differences between signal values of successive samples are reduced, which reduces resolution requirements. Unfortunately, typical oversampling ADC's are still particularly susceptible to overload distortion and granular noise.

A delta sigma ($\Delta\Sigma$) modulator ADC ($\Delta\Sigma$ ADC) sufficiently oversamples a given analog input signal so that only one quantizer bit is required. Some $\Delta\Sigma$ ADC's however, employ multi-bit quantizers to fuirther reduce quantization noise. A continuous time $\Delta\Sigma$ ADC (also known as a sigma-delta modulator ADC) typically includes a continuous time loop filter having integrators and transconductance amplifiers, which implements a bandpass loop filter and/or resonator, to reduce granular noise and overload distortion. The $\Delta\Sigma$ ADC includes one or more feedback loops, which include multi-bit feedback DAC's, to avoid the accumulation of quantization errors and to stabilize the $\Delta\Sigma$ ADC.

Unfortunately, conventional $\Delta\Sigma$ ADC's are often difficult to implement and are susceptible to noise resulting from delays in the quantizer feedback path. The delays include signal dependent jitter delay, latch delay, and DAC cell switching delays. To compensate for the excess latch delay, a plurality of additional multi-bit return-to-zero (RZ) digital-to-analog converters (DAC's) are selectively placed in the quantizer feedback path. (The RZ DAC's are DAC's whose outputs periodically reset to zero.) However, the additional RZ DAC's are often expensive and difficult to implement accurately. At the high sampling rates required for $\Delta\Sigma$ ADC's, the RZ DAC's in the quantizer feedback path may have insufficient time to settle to zero, resulting in poor ADC performance. For performance reasons, more cost-effective non-return-to-zero (NRZ) DAC's are typically not substituted in place of the RZ DAC's in conventional $\Delta\Sigma$ ADC designs.

In an alternative approach, some feedback delays are compensated via a combination of non-delayed and half-delayed appropriately tuned feedback DAC's. However, this approach still fails to effectively compensate for signal dependent jitter and other delays.

Finite DAC cell switching delays in the multi-bit feedback DAC's are also problematic. As is known in the art, multi-bit DAC's have hardware limitations that result in glitches in signal output by circuits employing these devices. Glitches result when less than all of the bits in a DAC change simultaneously. Hence, the output waveform exhibits temporary false values as the bits change to their appropriate values. The glitches cause spurious frequency tones, i.e., glitch noise, to appear at the DAC output very close to the desired output frequency. The spurious tones can degrade the performance of the accompanying $\Delta\Sigma$ ADC. Unmatched DAC cell switching delays reduce the dynamic range of the accompanying $\Delta\Sigma$ ADC and adversely affect circuit stability, especially in fourth order or higher order $\Delta\Sigma$ ADC's. The order of a given $\Delta\Sigma$ ADC is related to the number of resonating frequencies in the loop filter of the $\Delta\Sigma$ ADC.

The output of a feedback DAC also includes quantization noise that is directly related to the DAC's amplitude resolution. The number of bits used in the DAC computations determines amplitude resolution. DAC's with excellent amplitude resolution and frequency response tend to consume excess power and are expensive. In addition, spurious tones become more problematic as the frequency of the periodic signal increases. This further limits the range of allowable output frequencies.

Some conventional $\Delta\Sigma$ ADC's employ a high-speed flash quantizer, which includes multiple comparators for comparing sampled signal values to particular reference thresholds corresponding to quantization levels. A given sampled signal value is closer to the thresholds of some comparators than others. Consequently, the quantizer comparators switch and regenerate at different times, which results in undesirable signal dependent jitter delay.

Conventional ΔΣ ADC's employing RZ DAC's often fail to address signal dependent jitter. Signal dependent jitter is an additional source of loop delay in the quantizer feedback path. The additional loop delay reduces the dynamic performance of the ADC and may reduce feedback loop stability. An ADC with good dynamic performance accurately represents a given analog signal over a wide range of values and frequencies.

Hence, a need exists in the art for a cost-effective high-performance ΔΣ ADC that effectively compensates for quantizer feedback loop delays, including signal dependent jitter, latch delay, and finite DAC cell switching delay.

SUMMARY OF THE INVENTION

The need in the art is addressed by the high-performance analog-to-digital converter of the present invention. In the illustrative embodiment, the inventive analog-to-digital converter is a delta sigma modulator analog-to-digital converter and includes a first mechanism for converting an input analog signal to a digital output signal. The first mechanism is characterized by a noise transfer function that is altered relative to an ideal noise transfer function. A second mechanism compensates for the alteration in the transfer function via a single additional digital-to-analog converter.

In a specific embodiment, the alteration includes an additional pole and an additional zero included in the transfer function relative to the ideal noise transfer function. The alteration is induced by feedback delays in the first mechanism. The feedback delays include signal dependent jitter delay and feedback digital-to-analog converter cell switching delays. The second mechanism includes an additional latch for compensating for the signal dependent jitter delay.

The first mechanism includes a resonator and a quantizer. The second mechanism includes a quantizer-DAC feedback path from an output of the quantizer to the resonator. The feedback path includes a first latch positioned between an output of the quantizer and the additional digital-to-analog converter. The feedback path further includes an additional latch positioned at an output of the first latch. The additional latch eliminates signal dependent jitter delay in the analog-to-digital converter. The digital-to-analog converter is a non-return-to-zero digital-to-analog converter. An output of the digital-to-analog converter is connected to the resonator.

The novel design of the present invention is facilitated by the second mechanism, which includes an additional feedback digital-to-analog converter and an additional latch for compensating for signal dependent jitter delay and digital-to-analog converter cell switching delay. By compensating for the various feedback delays, the delta sigma modulator digital-to-analog converter of the present invention affords improved stability and dynamic range performance.

BRIEF DESCRIPTION OF THE DRAWINGS

FIG. 7 is a diagram of an $n^{th}$ order ΔΣ ADC constructed in accordance with the teachings of the present invention.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
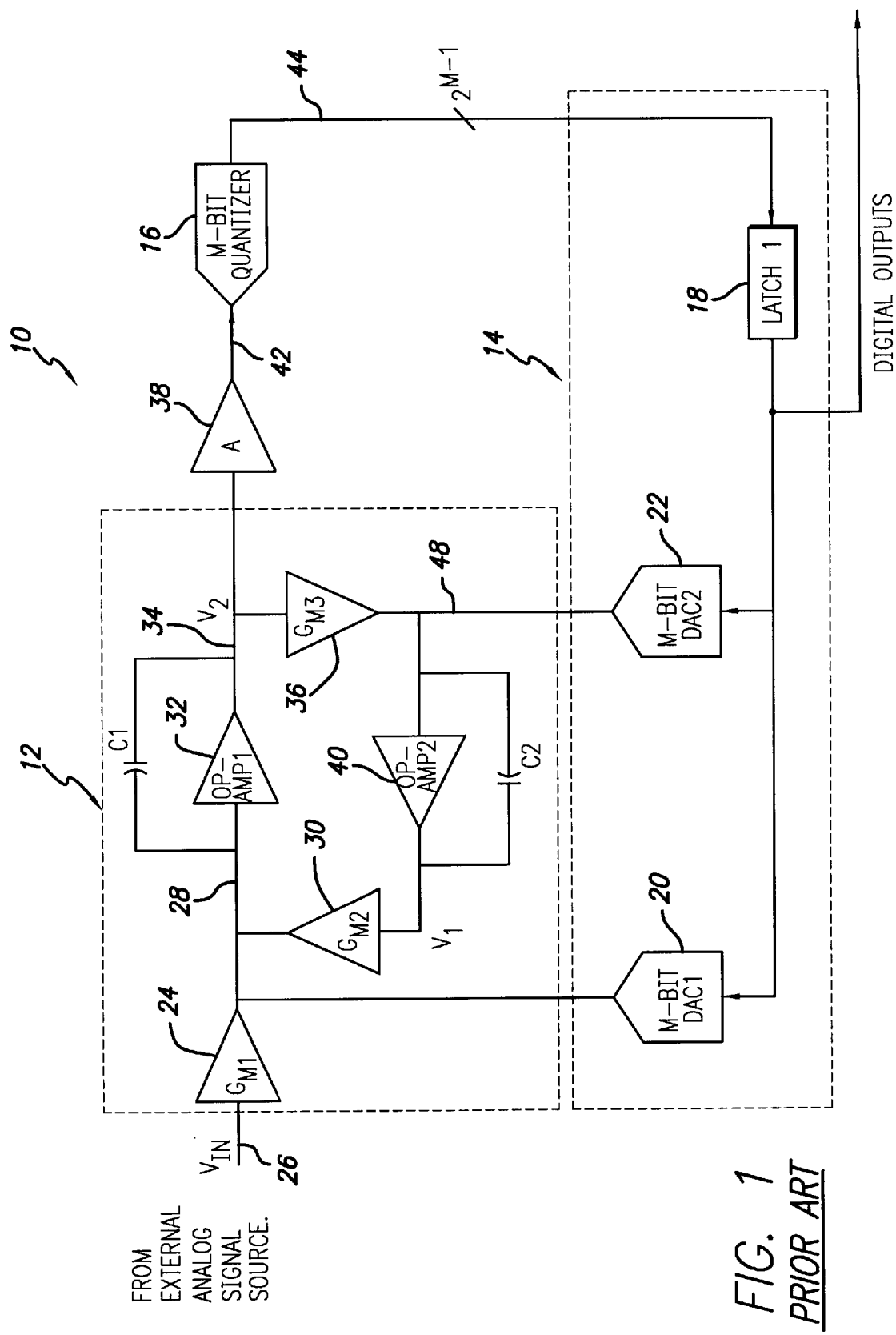
FIG. 1 is a diagram of an exemplary second order ΔΣ ADC including a resonator (bandpass loop filter) and an m-bit quantizer feedback path.

FIG. 1 is a diagram of a conventional second order ΔΣ ADC 10. The ΔΣ ADC includes a resonator stage 12 (bandpass loop filter) and an m-bit quantizer feedback-DAC path 14 from the output of an m-bit quantizer 16 back to the resonator stage 12. The feedback path 14 includes a first latch 18, which is connected at an output of the m-bit quantizer 16. An output of the first latch 18 is connected to an input of a first m-bit digital-to-analog converter (DAC) 20 and to an input of a second DAC 22.

The resonator stage 12 includes a first transconductance amplifier ($g_{m1}$) 24. An analog input ($V_{in}$) 26 of the first transconductance amplifier 24 corresponds to the input of the ΔΣ ADC 10. An output of the first transconductance amplifier 24 is connected at a first node 28. The node 28 is also connected to an output of a second transconductance amplifier ($g_{m2}$) 30, to an input of a first operational amplifier (op-amp1) 32, to one end of a first capacitor $C_1$, and to an output of the first DAC 20 of the quantizer feedback path 14.

An output of the first op-amp 32 is connected at a second node 34, which is characterized by a second nodal voltage ($V_2$). The second node 34 is also connected to a second end of the first capacitor $C_1$, to an input of a third transconductance amplifier ($g_{m3}$) 36, and to an input of a voltage amplifier (A) 38. An output of the third transconductance amplifier 36 corresponds to a last-stage node 48. The last-stage node 48 is connected to an output of the second m-bit DAC 22 of the quantizer feedback path 14, to an input of a second op-amp 40, and to a first end of a second capacitor $C_2$. An output of the second op-amp 40 is connected to a second end of the second capacitor $C_2$ and to an input of the second transconductance amplifier 30 at a node characterized by a first nodal voltage ($V_1$).

Op-amp1 32 and capacitor C1 form an integrator that integrates the output signal current of amplifiers $g_{m1}$ 24, $g_{m2}$ 30, and the current output from the m-bit feedback DAC1 20 at node 28. Similarly, op-amp2 40 and capacitor C2 form another integrator in the resonator 12.

An output 42 of the voltage amplifier 38 is connected to an input of the m-bit quantizer 16. The m-bit quantizer 16 is implemented as a bank of $2^{m-1}$ comparators in parallel with several reference voltage sources. The m-bit quantizer 16 includes $2^{m-1}$ comparators and corresponding latches and drives the first m-bit DAC 20 and the second m-bit DAC 22, which feed back into the resonator stage 12. Each comparator (not shown) compares the voltage level of a filtered and gain adjusted analog signal 40 output from the voltage amplifier 38 with various reference thresholds at predetermined time intervals. The predetermined time intervals are determined by the rate at which the quantizer 16 is clocked. The m-bit quantizer 16 outputs digital signals on $2^{m-1}$ output lines 44, which represent the reference thresholds that most closely correspond to the analog signal 42 at predetermined time intervals. Hence, the m-bit quantizer 16 essentially selects reference thresholds to approximate the filtered analog signal 42 and provides a digital signal as output in response thereto. Quantizers, which are flash analog-to-digital converter building blocks, such as the m-bit quantizer 16, are known in the art. The voltage amplifier (A) 38, which is placed before the m-bit quantizer 16, facilitates scaling of integrator output nodal voltages $V_1$ and $V_2$.

The first latch 18 is implemented as a bank of latches, one latch for each $2^{m-1}$ inputs from $2^{m-1}$ comparators in the m-bit quantizer 16. Similarly, the first feedback DAC 20 and the second feedback DAC 22 include banks of $2^{m-1}$ DAC's.

The gain of a transconductance amplifier is known as the transfer conductance. The transfer conductances of the transconductance amplifiers 24, 30, and 36 are represented by the symbols $g_{m1}$, $g_{m2}$, $g_{m3}$, respectively.

The ΔΣ ADC 10 is an intermediate frequency (IF) continuous time (CT) bandpass (BP) ΔΣ modulator ADC 10 with multi-bit quantizer-DAC feedback 14. The resonator stage 12 is a Gm-C (continuous time transconductance amplifier-integrator loop) bandpass filter that resonates at a desired IF frequency. For high order loop filters/resonators, the loop filter resonating frequencies may be optimally spread (not coincident) to form a widened pass band. The resonator 12, the amplifier A 38, the m-bit quantizer 16, and the feedback DAC's 14 form a $2^{nd}$ order ΔΣ modulator ADC.

The resonator stage 12 with the accompanying feedback 14 filters the analog input voltage signal 26 and provides a filtered analog signal ($V_2$) in response thereto to the voltage amplifier 38. The voltage amplifier 38 multiplies the amplitude of the filtered analog signal $V_2$ by a predetermined gain factor A and provides the filtered and gain-adjusted analog signal 42 as output in response thereto. The filtered and gain-adjusted analog signal 42 is provided as input to the m-bit quantizer 16, which converts the analog signal 42 to the m-bit quantizer output 44. The m-bit quantizer output 44 is fed back via the feedback path 14 to the resonator stage 12 via a first latch 18 and the first and second DAC's 20 and 22, respectively.

In the present specific embodiment, the output of the ΔΣ ADC 10 is taken at a ΔΣ ADC output 46 at the output of the latch 18. In the present embodiment, the ΔΣ ADC output 46 is taken at the output of the latch 18 and not at the m-bit quantizer output 44, since the digital bits output from the quantizer 16 have been regenerated by the latch 18 and are better defined dynamically.

The feedback path 14 completes a loop of the ΔΣ ADC 10, which includes the resonator stage 12, the voltage amplifier 38, and the m-bit quantizer 16 and the feedback path 14.

Traditionally, various ΔΣ ADC circuit parameters, such as transconductance gains $g_{m1}$, $g_{m2}$, $g_{m3}$, voltage amplifier gain A, and DAC currents ($g_1$, $g_2$), are determined by matching coefficients of a calculated second-order transfer function of the ΔΣ ADC 10 to an ideal second-order noise transfer function and solving the resulting equations for the appropriate circuit parameters. Unfortunately, traditional approaches typically do not account for an alteration of the noise transfer function due to signal dependent jitter delay occurring in the m-bit quantizer 16 and other delays, such as switching delays of cells in the DAC's 20 and 22. Partly as a consequence, signal dependent jitter and other feedback delays remain unaccounted for in traditional ΔΣ ADC designs. Furthermore systems that attempt to account for some excess delay often neglect signal dependent jitter effects or DAC cell switching delays, or visa versa, and are difficult and costly to implement. By neglecting the various feedback delays, the stability and performance of the ΔΣ ADC 10 is compromised.

Figure 2:
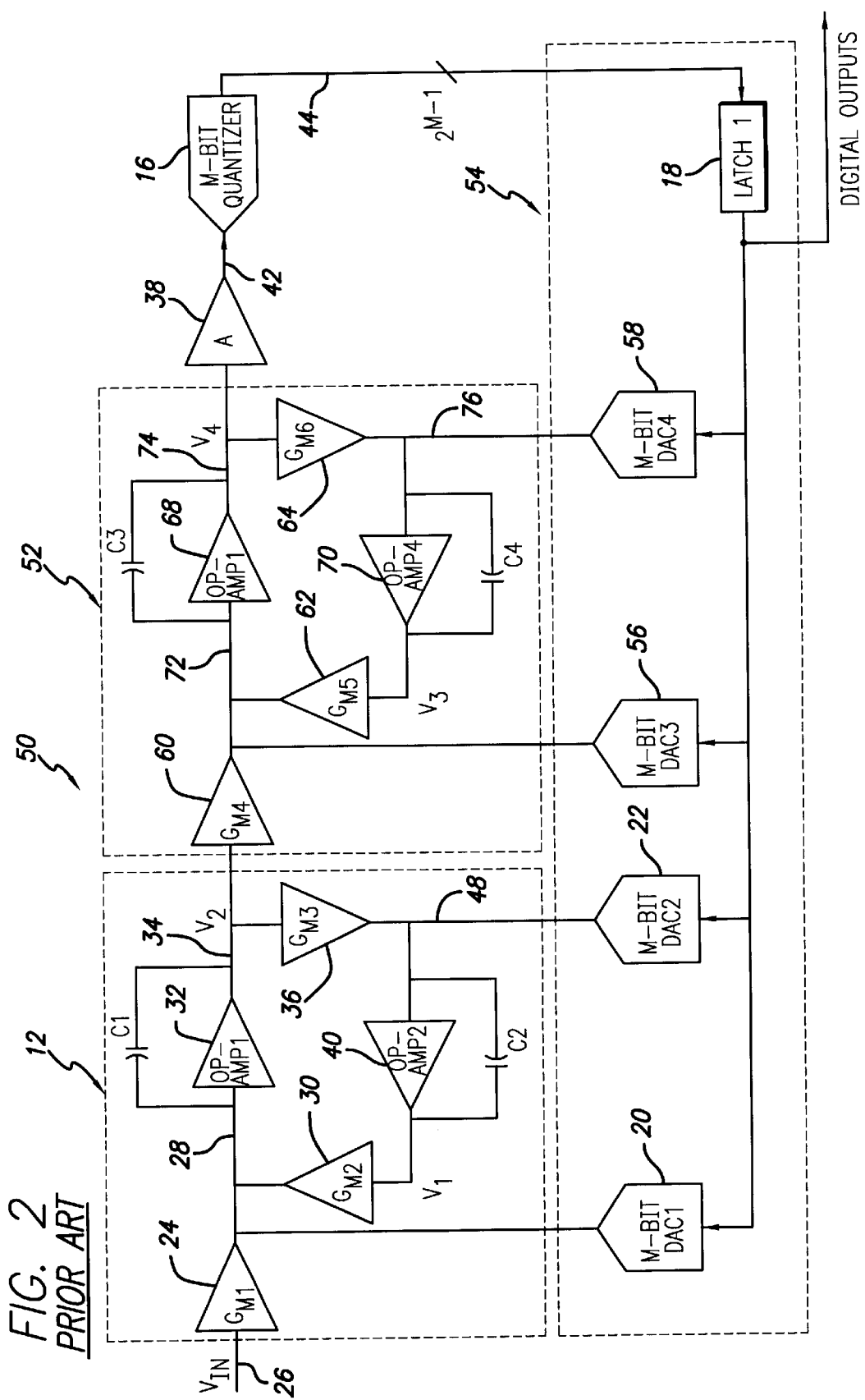
FIG. 2 is a diagram of an exemplary fourth order ΔΣ ADC including first and second resonator stages and a second order m-bit quantizer feedback path.

FIG. 2 is a diagram of a conventional fourth order ΔΣ ADC 50, which includes the first resonator stage 12, a second resonator stage 52, and a fourth order m-bit quantizer feedback path 54. The construction of the fourth order ΔΣ ADC 50 is similar to the construction of the second order ΔΣ ADC 10 of FIG. 1 with the exception that the fourth order ΔΣ ADC 50 includes the second resonator stage 52 inserted between the first resonator stage 12 and the voltage amplifier 38 before the m-bit quantizer 16. In addition, the fourth order feedback path 54 includes a third feedback DAC 56 and a fourth feedback DAC 58 that feed back to the second resonator stage 52 and whose inputs are connected at the output of the first latch 18. Furthermore, circuit parameters, such as transconductance gains, capacitances, and nodal voltages, may be different for the first resonator stage 12 of FIG. 2 than for the corresponding resonator stage 12 of FIG. 1.

The construction of the second resonator stage 52 is similar to the construction of the first resonator stage 12 with the exception that the first transconductance amplifier 24, the second transconductance amplifier 30 and third transconductance amplifiers 36 of the resonator stage 12 are replaced with a fourth transconductance amplifier 60, a fifth transconductance amplifier 62, and a sixth transconductance amplifier 64, respectively. In addition, the first op-amp 32 and the second op-amp 40 are replaced by a third op-amp 68 and fourth op-amp 70 in the second resonator stage 52. Furthermore, the first capacitor $C_1$ and second capacitor $C_2$ of the first resonator stage 12 correspond to the third capacitor $C_3$ and the fourth capacitor $C_4$, respectively, of the second resonator stage 52.

The node at the output of op-amp 40 characterized by the nodal voltage $V_1$ and the second node 34 ($V_2$) of the first resonator stage 12 correspond to a node at the output of op-amp 70 characterized by the nodal voltage $V_3$ and a fourth node 74 characterized by the nodal voltage $V_4$, respectively. In addition, circuit parameters, such as transconductance gains, capacitances, and nodal voltages, may be different for the second resonator stage 56 of FIG. 2 than for the corresponding resonator stage 12 of FIG. 1.

An input of the fourth transconductance amplifier 60 of the second resonator stage 52 is connected at the second node 34 of the first resonator stage 12. An output of the fourth transconductance amplifier 60 is also connected at the third node 72. The third node 72 is also connected at an output of the third DAC 56 of the fourth order feedback path 54. An output of the fourth DAC 58 is connected at a last-stage node 76, which corresponds to the output of the sixth transconductance amplifier 64. The last-stage node 76 is also connects an input of the fourth op-amp 20 and a first end of the fourth capacitor $C_4$. The fourth node 74 is connected at an input of the voltage amplifier (A) 38.

The ΔΣ ADC 50 has two resonator stages 12 and 52, which are fed by four feedback DAC's 20, 22, 56, and 58. The feedback DAC's 20, 22, 56, and 58 draw respective currents g1, g2, g3, and g4.

Unfortunately, the conventional $4^{nd}$ order ΔΣ ADC 50 suffers from similar problems as the second order ΔΣ ADC 10 of FIG. 1. Namely, the circuit elements included in the fourth order feedback path 54 are insufficient to compensate for signal dependent jitter, DAC cell switching delays, and other delays that alter the ideal noise transfer function of the ΔΣ ADC 50 as discussed more fully below.

The nodal voltages $V_1$ at the output of op-amp2 40 and $V_3$ at the output of op-amp4 70 represent integrator output voltage nodes, which represent states of a linear system in State Space formulation.

Figure 3:
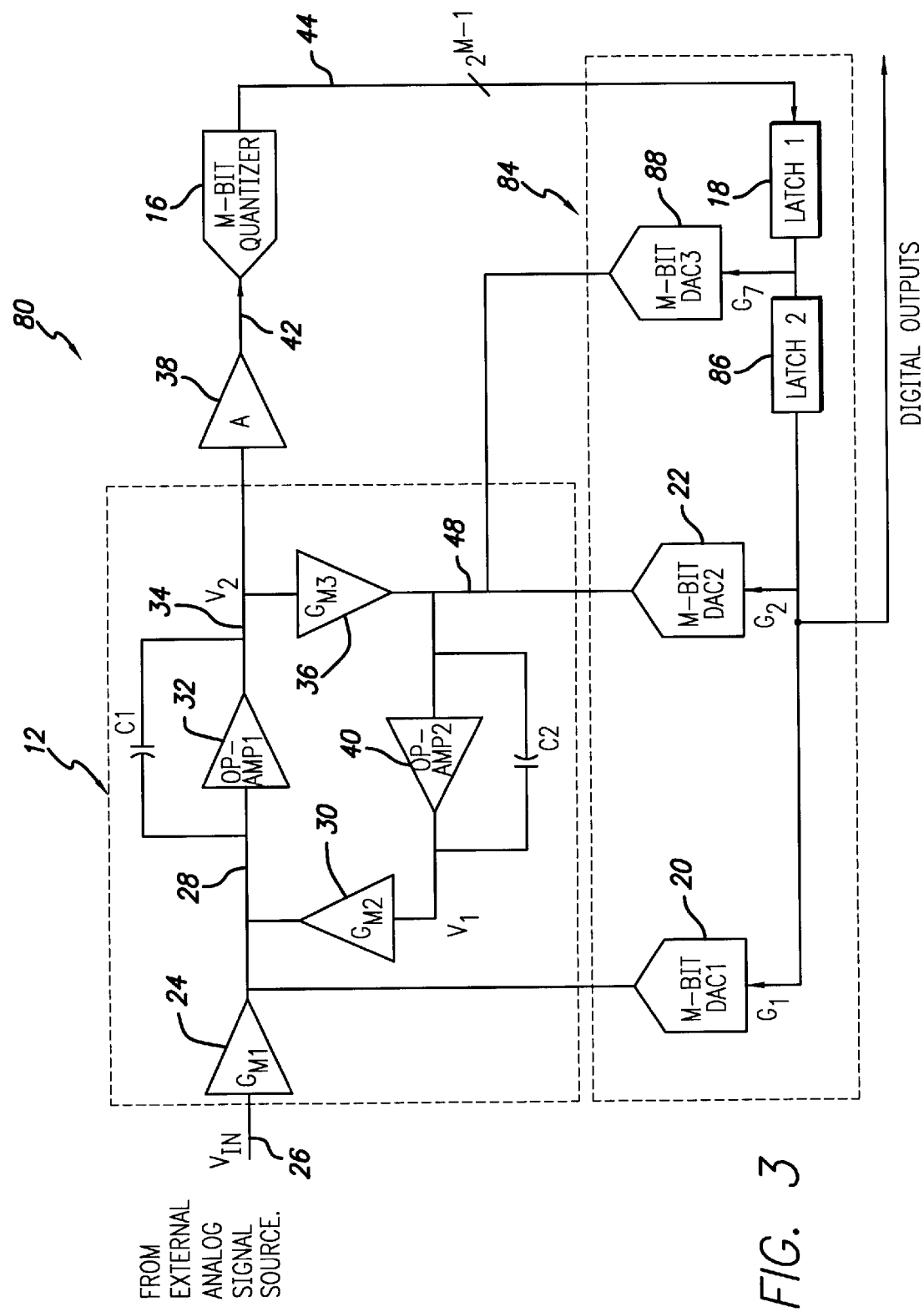
FIG. 3 is a diagram of an enhanced second order AL ADC constructed in accordance with the teachings of the present invention including a resonator and a delay-compensated m-bit quantizer feedback path.

FIG. 3 is a diagram of a second order ΔΣ ADC 80 constructed in accordance with the teachings of the present invention. The ΔΣ ADC 80 includes the first resonator stage 12 connected to the voltage amplifier (A) 38. An output 42 of the voltage amplifier 38 is connected to an input of the m-bit quantizer 16. An output of the m-bit quantizer 16 represents the output of the ΔΣ ADC 80 and is fed back to the first resonator stage 12 via a special delay-compensated m-bit quantizer feedback path 84. For clarity, various components and circuitry, such as power sources and lines and clocking signals and lines have been omitted from FIG. 3, but those skilled in the art will know where and how to implement the additional requisite circuitry.

The construction of the first resonator stage 12 is similar to the construction of the resonator stage 12 of FIGS. 1 and 2 with the exception that the various circuit parameters, such as transconductance gains ($g_{m1}$, $g_{m2}$ and $g_{m3}$) capacitances ($C_1$ and $C_2$) and circuit currents, and nodal voltages ($V_1$ and $V_2$) are different in the first resonator stage 12. These differences are partially due to the different and enhanced feedback path 84.

The construction of the enhanced feedback path 84 is similar to the construction of the feedback path 14 with the exception of the second latch 86, and additional m-bit feedback DAC 88. An input of the additional DAC 88 is connected to an output of the first latch 18. An output of the additional DAC 88 is connected to the first resonator stage 12 at the last-stage node 48. The output of the first latch 18 is also connected to an input of the second latch 86, an output of which is connected to an input of the first DAC 20 and the second DAC 22.

Those skilled in the art will appreciate that the latches 18 and 86 include several of latches, and the DAC's 20, 22, and 88 include several DAC cells, one for each comparator of the m-bit quantizer 16. For example, if the m-bit quantizer is implemented as a 5-bit quantizer, the latches 18 and 86 will each include 31 sub-latches, and the DAC's 20, 22, and 88 will each include 31 unary DAC cells. The quantizer 16 and the latches 18 and 86 are clocked by a system clock (not shown). The latches 18 and 86 are clocked in a master-slave configuration.

The additional latch 86, which is implemented as bank of latches with one latch for each comparator in the m-bit quantizer 16, eliminates signal dependent jitter delay. The additional latch 86 re-latches the digital output 44 of the m-bit quantizer 16 before the feedback DAC's 20, 22, and 88 are driven. This aligns digital outputs 40 of the m-bit quantizer 16 before cells of the DAC's 20, 22, and 88 are simultaneously switched. The additional latch 86 introduces a half-cycle delay in the quantizer feedback path 84 that is compensated for by the additional DAC 88 as discussed more fully below.

The additional DAC 88 is connected at the output of the first latch 18. The output of the additional DAC 88 is connected to the resonator stage 12 of the ΔΣ ADC 80. In higher order ΔΣ ADC's constructed in accordance with the teachings of the present invention, the output of the additional DAC 88 is connected to the last resonator stage 12, as discussed more fully below. The ΔΣ ADC 80 is least sensitive to any signal dependent jitter at the output of the additional DAC 88 when the DAC 88 is connected at the last resonator stage 12 due to the gain of any previous resonator stages.

However, those skilled in the art will appreciate that the additional DAC 88 may be connected to other resonating stages without departing from the scope of the present invention. When the additional DAC 88 is connected to another resonating stage, such as a previous resonator stage (as discussed more fully below), delay from the second latch 86 and switching delays of the cells of the DAC's 20 and 22 may still be compensated by selecting appropriate ΔΣ ADC parameters. An additional degree of freedom provided by the additional DAC 88, which allows compensation of the excess delay. The excess delay appears as an increase in the order of the ideal noise transfer function of the ΔΣ ADC 80, as discussed more fully below.

In the specific embodiment of FIG. 3, the ΔΣ ADC 80 of the present invention is an intermediate frequency (IF) continuous time (CT) bandpass (BP) ΔΣ modulator ADC 80 with multi-bit quantizer-DAC feedback 84. The ΔΣ ADC 80 achieves 14 to 16 effective bits of resolution over 60 to 100 MHz of signal bandwidth and digitizes intermediate frequencies (IF) directly at 100 to 500 MHz with today's process technology. The ΔΣ ADC 80 is designed for high dynamic range performance (14 to 16 bits). These characteristics make the ΔΣ ADC 80 particularly useful in high-resolution data converter applications in military and commercial digital receivers. The ΔΣ ADC 80 of the present invention and associated principles enable breakthrough ΔΣ ADC performance benefits.

Figure 4:
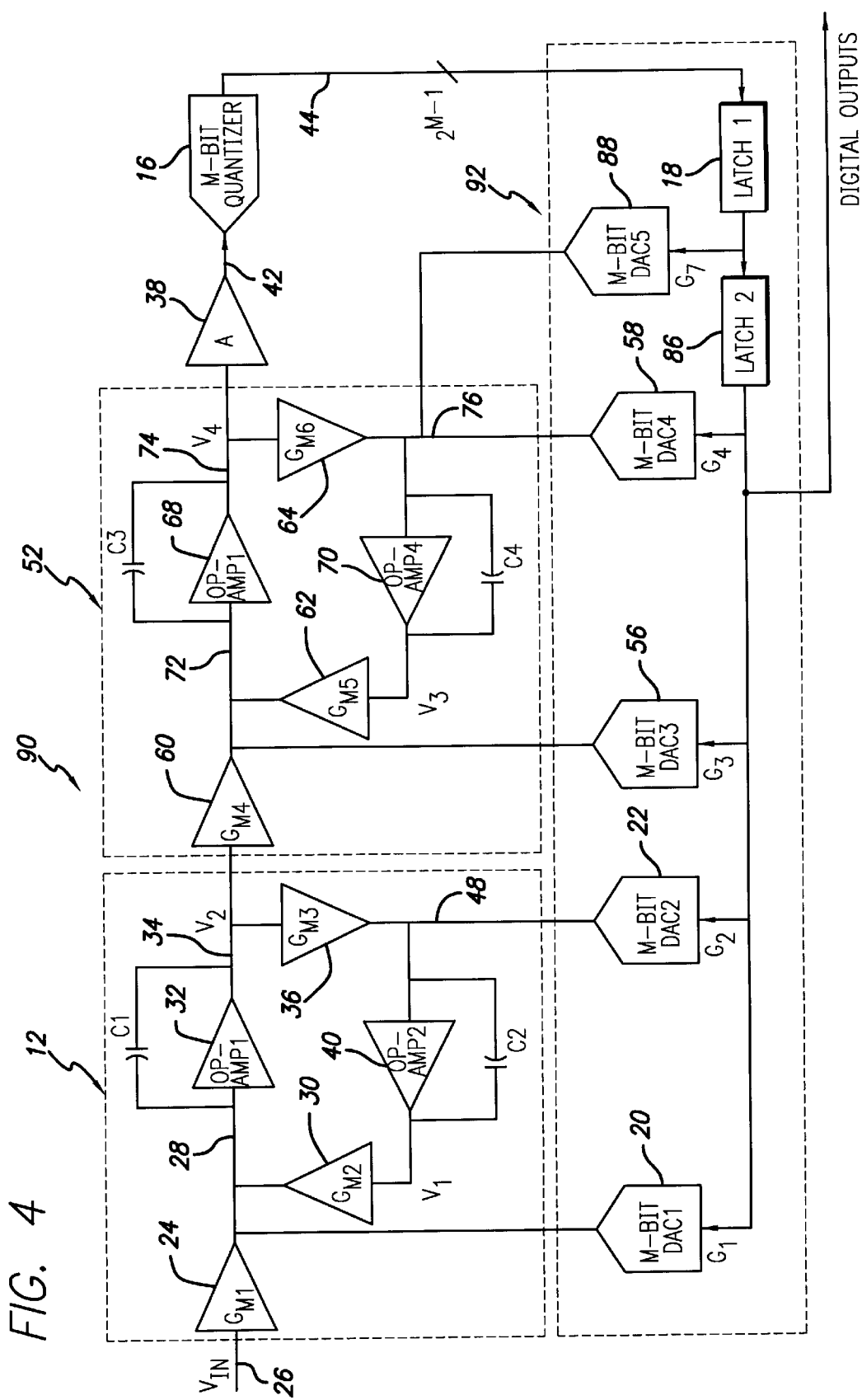
FIG. 4 is a diagram of an enhanced fourth order ΔΣ ADC constructed in accordance with the teachings of the present invention.

FIG. 4 is a diagram of a fourth order ΔΣ ADC 90 constructed in accordance with the teachings of the present invention. The ΔΣ ADC 90 is similar to the fourth order ΔΣ ADC 50 of FIG. 2 with the exception that the ΔΣ ADC 90 includes a special delay-compensated feedback path 92. In addition, the various circuit parameters, such as transconductance gains, capacitances, and nodal voltages are different for the ΔΣ ADC 90 than those for the ΔΣ ADC 50 of FIG. 4.

The special delay-compensated feedback path 92 is similar to the construction of the enhanced feedback path 84 of FIG. 3 with the exception that the third feedback DAC 56 and the fourth feedback DAC 58 are connected at the output of the second latch 86 and fed back to the second resonator stage 52. In addition, the additional DAC 88, which is connected at the output of the first latch 18, provides feedback to the second resonator stage at the last-stage node 76.

The parameters of the ΔΣ ADC 90, such as transconductance gains ($g_{m2}$, $g_{m2}$, $g_{m5}$, and $g_{m6}$) and capacitances ($C_1$, $C_2$, $C_3$, and $C_4$) are chosen to set the zeros of the noise transfer function of the ΔΣ ADC 90 in the desired passband. The desired passband is application-specific and may be determined by one skilled in the art to meet the needs of a given application. Inter-stage gains ($g_{m1}$, $g_{m4}$, and A) are selected so that the nodal voltages $V_1$, $V_2$, $V_3$, and $V_4$ are at practical values for a given application. Practical nodal voltage values for a given application may be determined by one skilled in the art.

DAC currents $g_1$, $g_2$, $g_3$, $g_4$, and $g_7$ corresponding to current through the DAC's 20, 22, 56, 58, and 88, respectively, are set in accordance with the modified noise transfer function of equation (2), using a method similar to that discussed for the second order ΔΣ ADC 80 of FIG. 3.

Figure 5:
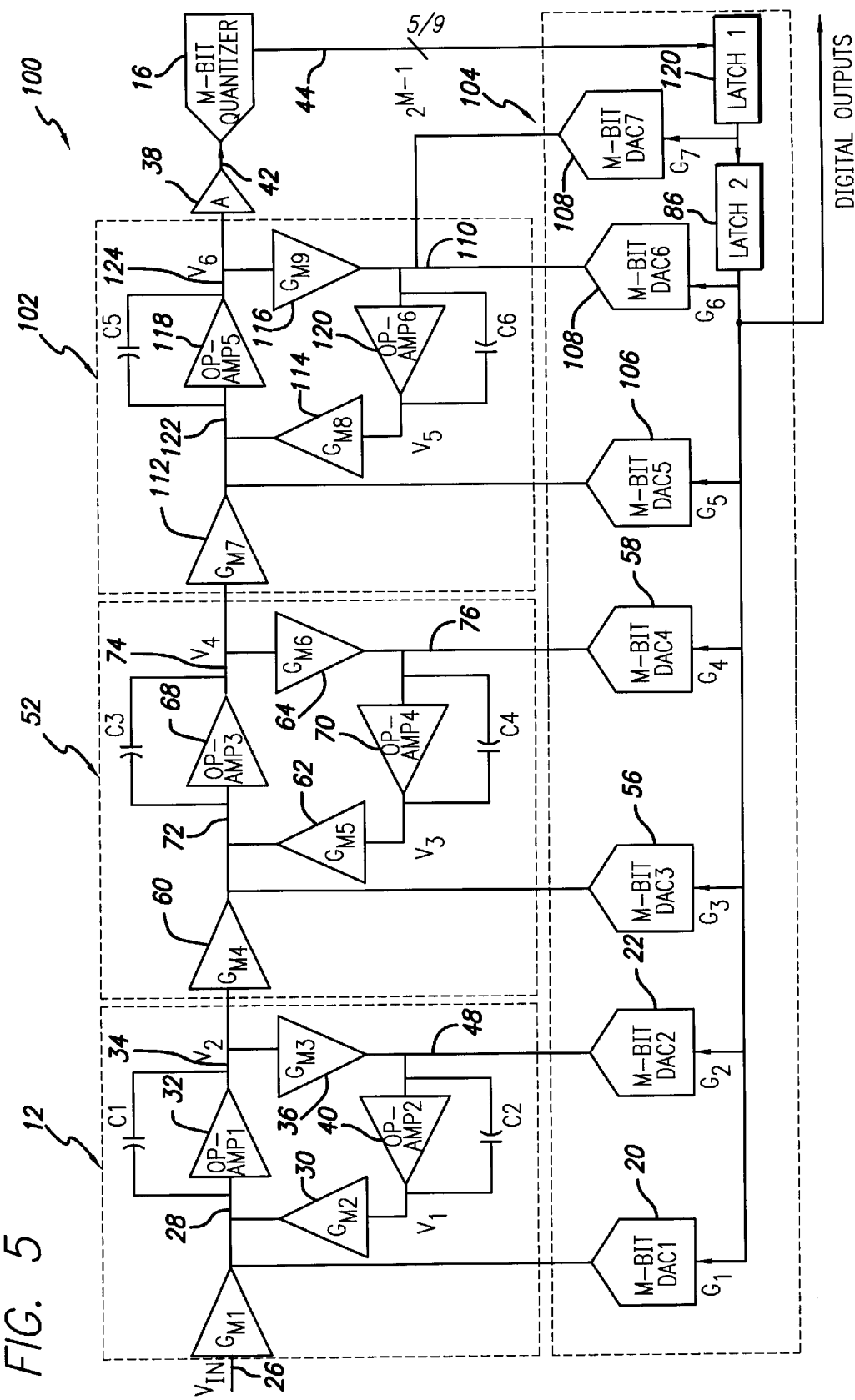
FIG. 5 is a diagram of an enhanced sixth order ΔΣ ADC constructed in accordance with the teachings of the present invention.

FIG. 5 is a diagram of a sixth order ΔΣ ADC 100 constructed in accordance with the teachings of the present invention. The construction of the sixth order ΔΣ ADC 100 is similar to the construction of the fourth order ΔΣ ADC 90 of FIG. 4 with the exception that the sixth order ΔΣ ADC 100 includes a third cascaded resonator stage 102 inserted between the second resonator stage 52 and the voltage amplifier 38. In addition, the sixth order ΔΣ ADC 100 includes an extended feedback path 104 that includes a fifth feedback DAC 106 and the additional feedback DAC 88 that feed back to the last resonator stage 102. An output of the additional feedback DAC 88 is connected at last-stage node 110 of the third resonator stage 102, which is also the last resonator stage. The last stage node 110 is analogous to the nodes 48 and 76 of the first resonator stage 12 and the second resonator stage 52, respectively.

The construction of the third resonator stage 102 is similar to the construction of the first resonator stage 12 and the second resonator stage 52. The third resonator stage includes a seventh transconductance amplifier 112, an eighth transconductance amplifier 114, and a ninth transconductance amplifier 116, which are analogous to the transconductance amplifiers 60, 62, and 64, respectively of the second stage resonator stage 52. The third resonator stage also includes a fifth op-amp 118, a sixth op-amp 120, a fifth capacitor $C_5$, and a sixth capacitor $C_6$, which are analogous to the op-amps 68 and 70 and the capacitors $C_3$ and $C_4$, respectively, of the second resonator stage 52. The third resonator stage 102 also includes a node at the output of op-amp 120 characterized by the nodal voltage $V_5$ and a node 124 characterized by the nodal voltage $V_6$, which are analogous to the node $V_3$ and the fourth node ($V_4$) 74 of the second resonator stage 52, respectively.

The parameters of the ΔΣ ADC 100 are chosen so that the transfer function of the ΔΣ ADC 100 matches an altered ideal transfer function (see equation (2)) that accounts for various feedback delays. The additional DAC 88 and the additional latch 86 facilitate the accommodation of the adjusted ideal noise transfer function. Accordingly, undesirable effects of feedback delays in the feedback path 104 are eliminated, and the dynamic performance and stability of the ΔΣ ADC 100 are enhanced.

Figure 6:
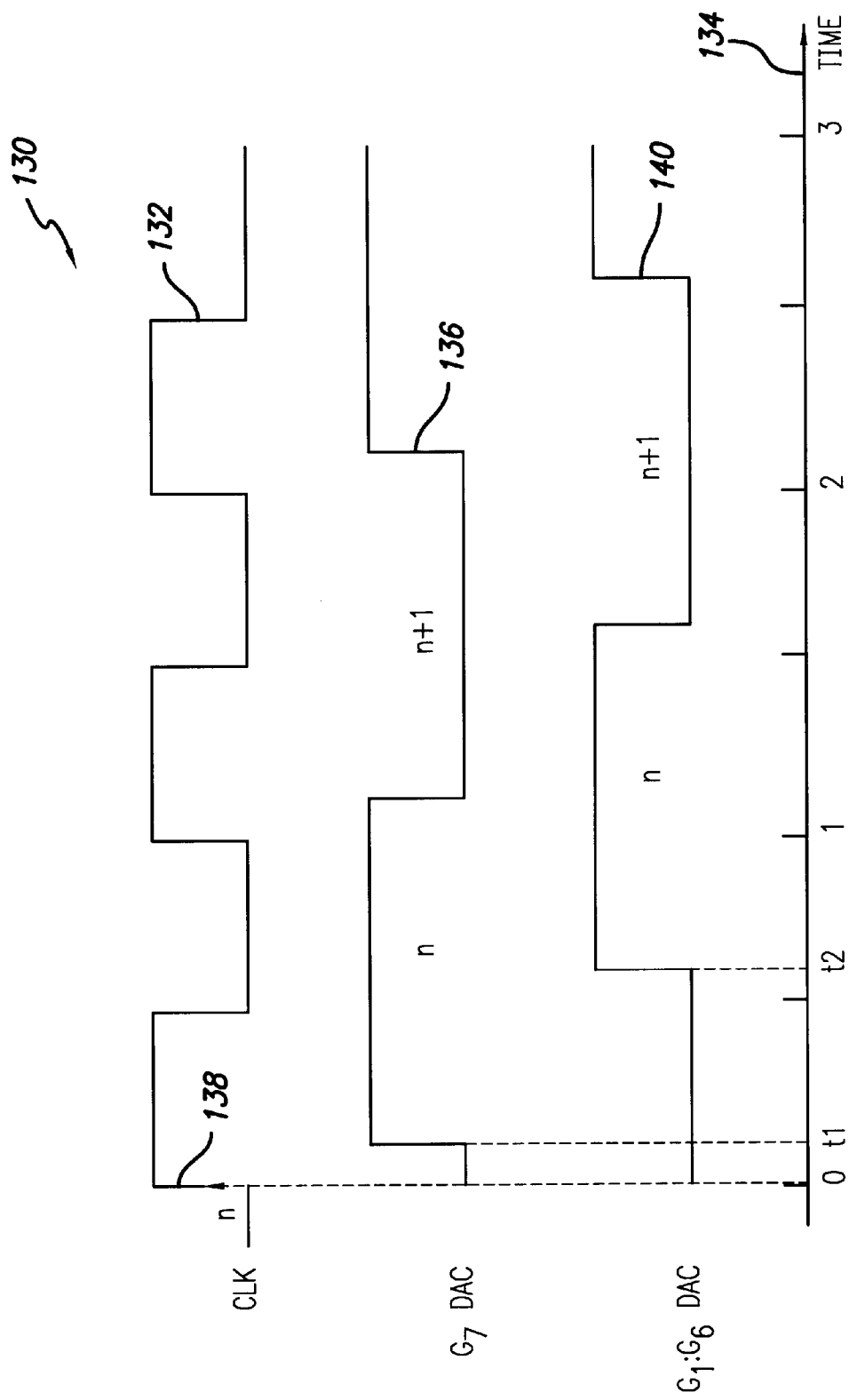
FIG. 6 is a timing diagram illustrating quantizer feedback path delays, which are compensated for in the ΔΣ ADC's of FIGS. 3–5.

FIG. 6 is a timing diagram 130 illustrating quantizer feedback path delays $t_i$ and $t_2$, which are compensated for in the ΔΣ ADC's 80, 90, and 100 of FIGS. 3–5, respectively. The diagram 130 shows a clock signal voltage profile 132 with respect to time as indicated along a time axis 134. The clock signal is applied to the comparators of the quantizer 16 and to the individual latches of the latch1 120 and latch2 86 banks. A first DAC current signal profile 136 corresponds to the current signal flowing through the additional feedback DAC 88 of FIG. 5. The DAC current signal profile 136 is delayed relative to a rising edge 138 of the clock signal voltage profile 132 by $t_1$. A second DAC current signal profile 140 corresponds to an exemplary current signal flowing through the feedback DAC's 20, 22, 56, 58, 106, and 88 of the feedback path 104 of the ΔΣ ADC 100 of FIG.

5. The second DAC current signal profile 140 is delayed relative to the rising edge 138 of the clock signal profile 132 by $t_2$.

See equations (6) through (9) below to see an example of how various ΔΣ ADC parameters are chosen to compensate for the delays $t_1$ and $t_2$ with the help of the additional feedback DAC 88 and the additional feedback latch 86.

The ΔΣ ADC's of the present invention compensates for the finite DAC cell switching delay $t_1$ of the additional DAC 88 ($g_7$) and the cell switching delays $t_2$ of the DAC's 20, 22, 56, 58, 106, and 88 ($g_1$ through $g_6$).

Using state space formulations, one skilled in the art may derive the z-domain transfer function of the ΔΣ ADC that results in appropriate DAC feedback currents ($g_1$ through $g_7$) that will compensate for the known delays $t_1$ and $t_2$. $t_2$ includes the delays of the DAC's 20, 22, 56, 58, 106, and 88, such as cell switching delays, in addition to a half-cycle delay introduced from re-latching the output of the quantizer 16 with the additional latch 86.

FIG. 7 is a diagram of an $n^{th}$ order ΔΣ ADC 150 constructed in accordance with the teachings of the present invention. The construction of the ΔΣ ADC 150 is similar to the construction of the AL ADC 100 of FIG. 5 with the exception that the ΔΣ ADC 150 includes n/2 resonator stages, including the first resonator stage 12 and the second resonator stage 52. In addition, the ΔΣ ADC 150 includes an extended feedback path 152 that includes n feedback DAC's and the additional DAC 88. An output of the additional DAC 88 is fed back to a last-stage node 156 of a last resonator stage 154. The last-stage node 156 is analogous to the last-stage node 110 of the third resonator stage 102 of FIG. 5. The last resonator stage 154 includes transconductance amplifiers ($g_{m2n-1}$) 158, ($g_{m2n}$) 160, and ($g_{m2n+1}$) 162; includes op-amps 164 and 166; nodes ($V_{n-1}$) 170, ($V_n$) and a last stage node 172; and capacitors $C_{n-1}$ and $C_n$. The above components of which are connected in a configuration analogous to the configuration of the resonator stages 12 and 52.

The ΔΣ ADC 150 is an intermediate frequency (IF) continuous time (CT) bandpass (BP) ΔΣ modulator ADC 150 with multi-bit quantizer-DAC feedback 152. The resonators 12, 52, ..., 154 and accompanying feedback path 152 implement a bandpass loop filter that resonates at a desired IF frequency. The loop filter is an $n^{th}$ order Gm-C (transconductance capacitive) resonator. The m-bit quantizer 16, which includes $2^{m-1}$ comparators and latches, drives n m-bit DAC's 168 that feed back into the resonator stages 12, 52, ..., 154. The n m-bit DAC's 168 include last and second to last feedback DAC's 174 and 176, respectively.

An ideal noise transfer function of an $n^{th}$ order ΔΣ ADC (not shown) does not account for feedback delay effects, such as signal dependent jitter delay in comparators of multi-bit quantizers, latch delay, and finite DAC cell switching delays, and is represented by the following equation:

$$H_{ntfl}(z) = \frac{A_1(z)}{B_1(z)} = \frac{a_0 + a_1 z + \ldots + a_n z^n}{b_0 + b_1 z + \ldots + b_n z^n}, \qquad [1]$$

where $a_1$ through $a_n$ and $b_1$ through $b_n$ are various constant coefficients, n is the order of the transfer function $H_{ntfl}(z)$, and z is a complex variable. The values of the constants a, through an determine the zeros of the numerator $A_1(z)$, which are the zeros of the transfer function $H_{ntfl}(z)$. The values of the constants $b_1$ through $b_n$ determine the zeros of the denominator $B_1(z)$ which are the poles of the transfer function $H_{ntfl}(z)$.

The locations of the poles and zeros of the transfer function $H_{ntf1}(z)$ relative to the unit circle in the complex plane determine the stability and performance characteristics of the transfer function $H_{ntf1}(z)$. The zeros of $H_{ntf1}(z)$ are chosen to achieve a desired frequency response having a center frequency in particular location in the passband. The exact location of the center frequency for a given passband and the exact coefficient values are application-specific and may be determined by one skilled in the art to meet the needs of a given application.

For $\Delta\Sigma$ ADC's with multiple resonator stages, wide bandwidth is obtained by spreading center frequencies of individual resonator stages so that the zeros of the transfer function $H_{ntf1}(z)$ are optimally spread in the passband. The $n^{th}$ order $\Delta\Sigma$ ADC 150 includes at least n feedback DAC's 168 to specify the requisite n degrees of freedom to implement the ideal noise transfer function $H_{ntf1}(z)$ of equation (1).

In practice, $\Delta\Sigma$ ADC's, such as the $\Delta\Sigma$ ADC's 10 and 50 of FIGS. 1 and 2, respectively, exhibit various feedback delays which result in a noise transfer function $H_{ntf}(z)$ that is different from the ideal noise transfer function $H_{ntf1}(z)$ of equation (1). $H_{ntf}(z)$ is a higher order transfer function than $H_{ntf1}(z)$.

In a previous approach, a modified z-transform was employed to analyze the effects of the excess delay on the ideal noise transfer function $H_{ntf1}(z)$, however resulting attempts to correct the delay and corresponding increase in the order of the ideal noise transfer function failed to account for signal dependent jitter, which is manifested as quantizer delay applied before the feedback DAC's 168.

Feedback delays are non-ideal effects in a quantizer DAC feedback path, such as the path 24 of FIG. 1, that raise the order of the ideal noise transfer function $H_{ntf1}(z)$ by one and result in the noise transfer function $H_{ntf}(z)$ described by the following equation:

$$H_{ntf}(z) = \frac{A(z)}{B(z)} = \frac{z(a_0 + a_1 z + \ldots + a_n z^n)}{(z - e_0)(b_0 + b_1 z + \ldots + b_n z^n)}. \quad [2]$$

$H_{ntf}(z)$ is similar to the noise transfer function $H_{ntf1}(z)$ of equation (1) with the exception that an additional zero at $z=0$ occurs in the numerator $A(z)$, and an additional real pole at $z=e_0$ occurs in the denominator $B(z)$, where $e_0$ is a real number.

The additional $(n+1)^{th}$ DAC 88 provides an additional degree of freedom, which accounts for the increase in the order of the ideal noise transfer function $H_{ntf1}(z)$ of equation (1) and results in the noise transfer function $H_{ntf}(z)$ of equation (2). The additional degree of freedom allows one to solve for the appropriate currents in each DAC 168 and 88 that yield the optimal $\Delta\Sigma$ ADC performance and compensate for switching delays of the cells of the DAC's 168 and 88.

Analysis of complex pole pairs and real pole trajectories of the noise transfer function $H_{ntf}(z)$ of equation (2) suggests that the poles move toward the outside of the z-plane unit circle when excess delay in the quantizer feedback path 152 of the $\Delta\Sigma$ ADC 150 is increased. As the poles move toward the outside of the unit circle, the $\Delta\Sigma$ ADC 150 becomes increasingly unstable. By eliminating excess delay, the stability of the $\Delta\Sigma$ ADC 150 of the present invention is improved.

$B(z)$ of equation (2) has a pole at $e_0$, which may be placed anywhere on the real axis after delay compensation. For the purposes of the present discussion, the pole at $e_0$ is placed at zero such that $e_0=0$. Consequently, $B(z)$ becomes:

$$B(z) = z(b_0 + b_1 z + \ldots + b_{n-1} z^{n-1} + z^n). \quad [3]$$

The transfer function of an $n^{th}$ order $\Delta\Sigma$ ADC 150 (where n is a positive integer), as discussed more fully below, is described by the following equation:

$$H_{ADC}(z) = \frac{K(z)}{C(z)} = \frac{k_0 + k_1 z + \ldots + k_n z^n + k_{n+1} z^{n+1}}{c_0 + c_1 z + \ldots + c_n z^n + c_{n+1} z^{n+1}}, \quad [4]$$

where $k_1$ to $k_{n+1}$ of the numerator $K(z)$ are constants that depend on various circuit parameters of the $n^{th}$ order $\Delta\Sigma$ ADC 150. Expressions for the $k_i$'s, where $i=0$ to $n+1$, in terms of circuit parameters of the $n^{th}$ order $\Delta\Sigma$ ADC 150 may be determined by one ordinarily skilled in the art. Similarly, the coefficients $c_i$, where $i=0$ to $n+1$, of the denominator $C(z)$ are also constants that depend on various circuit parameters of the $n^{th}$ order $\Delta\Sigma$ ADC 150. One ordinarily skilled in the art may determine expressions for $c_1$ to $c_{n+1}$ in terms of various $\Delta\Sigma$ ADC circuit parameters.

The coefficients $c_1$ through $C_n$ and $d_1$ through $d_n$ are expressed in terms of circuit parameters, such as transconductance ($g_{m1}$ through $g_{m(2n+1)}$), integrator capacitance ($C_1$ through $C_n$), DAC currents ($g_1$ through $g_{n+1}$) and quantizer gain (A). The coefficients, $c_1$ through $C_n$ and $d_1$ through $d_n$, of $H_{ADC}(Z)$ are matched term by term with the coefficients $a_1$ through $a_n$ and $b_1$ through $b_n$ of the noise transfer function $H_{ntf}(z)$, respectively, to yield a set of equations. The resulting set of equations is solved for the various circuit parameters as discussed more fully below. Consequently, the $n^{th}$ order $\Delta\Sigma$ ADC 150 will have the desired resonator center frequencies and noise shaping performance characteristics.

Equating the coefficients $c_i$ of $C(z)$ of the transfer function $H_{ADC}(Z)$ of the $n^{th}$ order $\Delta\Sigma$ ADC 150 to the corresponding coefficients of $B(z)$ results in the following set of $n+1$ equations:

$$c_0 = 0, c_1 = b_0, c_2 = b_1, \ldots, c_n = b_{n-1}. \quad [5]$$

Note that $C_{n+1}=1$ in the $H_{ADC}$ equation (4). $b_n=1$ in the $H_{ntf}$ equation (2). $C_{n+1}=b_n$, i.e., $1=1$. There are $n+1$ degrees of freedom in a system characterized by excess delay, which required only $n+1$ equations to fully solve and specify the system.

The equations (5) are solved for various $\Delta\Sigma$ ADC circuit parameters that comprise each coefficient $c_i$, as discussed more fully below. The resulting values for the circuit parameters, which include transconductance gains, DAC currents, DAC delays, and capacitor values, are employed in the $n^{th}$ order $\Delta\Sigma$ ADC 150 to achieve optimal performance.

Similarly, the coefficients $k_i$, where $i=1$ to $n+1$, of the numerator $K(z)$ of the transfer function $H_{ADC}(Z)$ of FIG. 4 are equated to the corresponding coefficients $(0, a_1, \ldots a_n)$ of the noise transfer function $H_{ntf1}(z)$ of FIG. 1. The resulting set of equations is solved, which yields $\Delta\Sigma$ ADC parameters, such as transconductance gains ($g_{m2}$, $g_{m3}$, ..., $g_{m2n}$, $g_{m(2n+1)}$) and capacitances ($C_1$, $C_2$, ..., $C_n$), that set the zeros of $H_{ADC}(z)$ of equation (4) at the center of the passband. Interstage transconductance gains ($g_{m1}$, $g_{m4}$, ..., $g_{m(2n-1)}$) and quantizer gain (A) are selected to scale the nodal voltages ($V_1$, $V_2$, ..., $V_n$) to practical values. The exact values for the above parameters are application-specific and may be determined by one skilled in the art to meet the needs of a given application. One skilled in the art, with access to the present teachings can solve for the appropriate $\Delta\Sigma$ ADC parameters that will place the zeros of the transfer function $H_{ADC}(z)$ of the $n^{th}$ order $\Delta\Sigma$ ADC 150 at the center of the passband and yield practical nodal voltages. The $n+1$ equations (5) are solved uniquely for $n+1$ DAC feedback current variables $g_1, g_2, \ldots, g_n, g_{n+1}$.

In the specific embodiment of FIG. 3, the DAC current feedback variables are $g_1$, $g_2$, and $g_7$ and correspond to the currents drawn by the first DAC 20, the second DAC 22, and the additional DAC 88, respectively. With reference to FIG. 3, for the second order ΔΣ ADC 80, the DAC currents $g_1$, $g_2$, and $g_7$ are solved uniquely in terms of the noise transfer function coefficients $b_0$, $b_1$, and $b_2$, the ΔΣ ADC parameters: $g_{m2}$, $g_{m3}$, $c_1$, $c_2$, A, and the delays $t_1$, and $t_2$. By equating the coefficients $c_0$, $C_1$, $c_2$ of the transfer function of the ΔΣ ADC 80, which include three unknown currents $g_1$, $g_2$, and $g_7$, to $b_0$, $b_1$, and $b_2$, of the corresponding noise transfer function (see equation (2)), three equations and three variables ($g_1$, $g_2$, and $g_7$) result, as discussed more fully below. The resulting set of equations may be solved uniquely for the DAC currents $g_1$, $g_2$, and $g_7$. The three simultaneous equations for the ΔΣ ADC 80 are given below:

$$c_0 = A \left( -g_2 - g_7 + g_7 \cos\left(\frac{\sqrt{g_{ma} g_{mb}} \cdot t_1}{\sqrt{c_1 c_2}}\right) + \right.$$

$$\left. g_2 \cos\left(\frac{\sqrt{g_{ma} g_{mb}} \cdot t_2}{\sqrt{c_1 c_2}}\right) + \frac{\sqrt{c_2} \cdot g_1 \sqrt{g_{mb}} \cdot \sin\left(\frac{\sqrt{g_{ma} g_{mb}} \cdot t_2}{\sqrt{c_1 c_2}}\right)}{\sqrt{c_1 g_{ma}}} \right), \quad [6]$$

$$c_1 = g_{mb} + 2A(g_2 + g_7) \cos\left(\frac{\sqrt{g_{ma} g_{mb}}}{\sqrt{c_1 c_2}}\right) - \quad [7]$$

$$A g_7 \cos\left(\frac{\sqrt{g_{ma} g_{mb}} \cdot (t_1 - 1)}{\sqrt{c_1 c_2}}\right) - A g_7 \cos\left(\frac{\sqrt{g_{ma} g_{mb}} \cdot t_1}{\sqrt{c_1 c_2}}\right) -$$

$$A g_2 \cos\left(\frac{\sqrt{g_{ma} g_{mb}} \cdot (t_2 - 1)}{\sqrt{c_1 c_2}}\right) - A g_2 \cos\left(\frac{\sqrt{g_{ma} g_{mb}} \cdot t_2}{\sqrt{c_1 c_2}}\right) -$$

$$\frac{A \sqrt{c_2 g_{mb}} \cdot g_1 \sin\left(\frac{\sqrt{g_{ma} g_{mb}} \cdot (t_2 - 1)}{\sqrt{c_1 c_2}}\right)}{\sqrt{c_1 g_{ma}}} - \frac{A \sqrt{c_2 g_{mb}} \cdot g_1 \sin\left(\frac{\sqrt{g_{ma} g_{mb}} \cdot t_2}{\sqrt{c_1 c_2}}\right)}{\sqrt{c_1 g_{ma}}},$$

$$c_2 = -2 g_{mb} \cos\left(\frac{\sqrt{g_{ma} g_{mb}}}{\sqrt{c_1 c_2}}\right) + A \left( -g_2 - g_7 + g_7 \cos\left(\frac{\sqrt{g_{ma} g_{mb}} \cdot (t_1 - 1)}{\sqrt{c_1 c_2}}\right) + \right. \quad [8]$$

$$\left. g_2 \cos\left(\frac{\sqrt{g_{ma} g_{mb}} (t_2 - 1)}{\sqrt{c_1 c_2}}\right) + \frac{\sqrt{c_2 g_{mb}} \cdot g_1 \sin\left(\frac{\sqrt{g_{ma} g_{mb}} \cdot (t_2 - 1)}{\sqrt{c_1 c_2}}\right)}{\sqrt{c_1 g_{ma}}} \right),$$

where the various parameters are as given above.

Note that $g_{m1}$ does not appear in the above equations. $g_{m1}$ is outside the modulator feedback loop and is a scale factor for the input signal 26 before the signal is modulated in the ΔΣ modulator ADC loop 100. $g_{m1}$ does not enter into the above equations (6 through 8) when solving for the DAC currents for a stable system. $g_{m1}$ is chosen in accordance with other design considerations such as optimal nodal scaling and low input noise requirements, for which one skilled in the art may choose an appropriate value for a particular application.

With reference to FIGS. 3 and 7, an exemplary noise transfer function for the ΔΣ ADC 80 of FIG. 3 is given below:

$$H_{ntf}(z) = \frac{1 - 1.8z + z^2}{0.382 - 1.02z + z^2}. \quad [9]$$

The poles of $H_{ntf}(z)$ are chosen for optimal noise-shaping to achieve the highest signal-to-noise ratio (SNR) in a specified bandwidth for a given level of stable input signal range. $H_{ntf}(z)$ is typically calculated with the aide of an optimization program that computes the coefficients $a_1$ through $a_n$ and $b_1$ through $b_n$ that yield the optimal pole and zero locations. The noise transfer function $H_{ntf}(z)$ of equation (9), $b_0=0.382$, $b_1-1.02$, and $b_2=1$.

For the noise transfer function $H_{ntf}(z)$ of equation (9), equations (6) through (8) may be solved for appropriate DAC currents for one implementation. In the specific embodiment of FIG. 3, the ΔΣ ADC parameters are as follows: $g_{m1}=1/25$, $g_{m2}=1/30$, $g_{m3}=1/120$, $c_1=1/(15\pi/4)$, $c_2=4/(15\pi/4)$, A=6.25, $t_1=0.2$, $t_2=0.046$, $g_7=-0.049$. The sampling clock frequency is normalized to 1 Hz.

Similarly, a fourth order, a sixth order, or an n-th order ΔΣ ADC can be solved uniquely for the n+1 DAC currents by employing the methods of the present invention, thereby compensating for ΔΣ ADC feedback path delays. Compensation of excess loop delay via application of the principles of the present invention is particularly desirable in fourth order and higher order ΔΣ ADC's, where excess feedback path delay can greatly impact ΔΣ ADC loop stability. Those skilled in the art may employ software packages in symbolic algebra such as Mathematica to determine appropriate parameter values for an arbitrary order ΔΣ ADC's in accordance with the present invention to achieve delay compensation and associated performance benefits.

Time domain simulation performed via Matlab Simulink verifies that the delay in the ΔΣ ADC quantizer feedback path 84 is compensated, that the ΔΣ ADC 80 of FIG. 3 is stable, and that the SNR of the ΔΣ ADC 80 in a specified bandwidth is equivalent to a delay-free model ΔΣ ADC.

Figure 8:
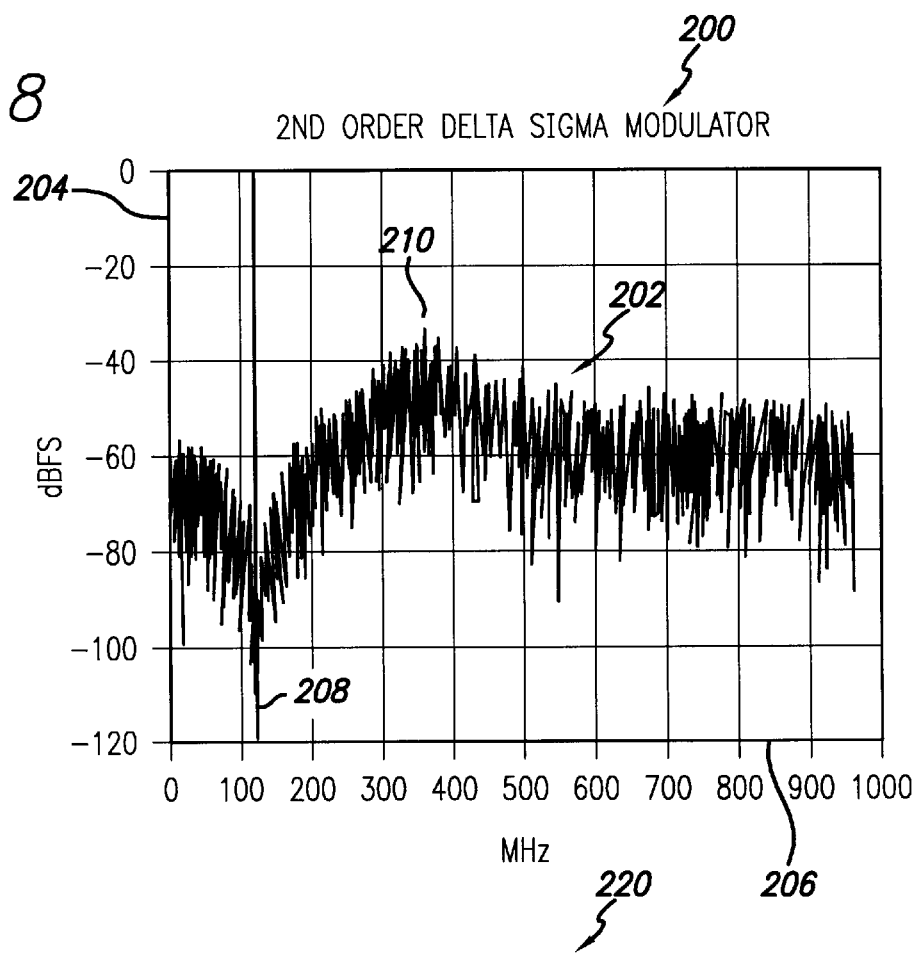
FIG. 8 is a graph of a simulated frequency response of the second order ΔΣ ADC of FIG. 1.

FIG. 8 is a graph 200 of a simulated frequency response 202 of the conventional second order ΔΣ ADC 10 of FIG. 1. The graph 200 includes a vertical axis 204, which represents ΔΣ ADC gain in decibels and includes a horizontal axis 206, which represents frequency in megahertz. The frequency response includes a low 208 at approximately 120 MHz and −120 dB and a peak 210 at approximately 350 MHz and −35 dB before leveling off between approximately −50 dB and −80 dB. The peak 210 partially results from excess delay in the ΔΣ ADC feedback path 14 of FIG. 1 and is undesirable.

Figure 9:
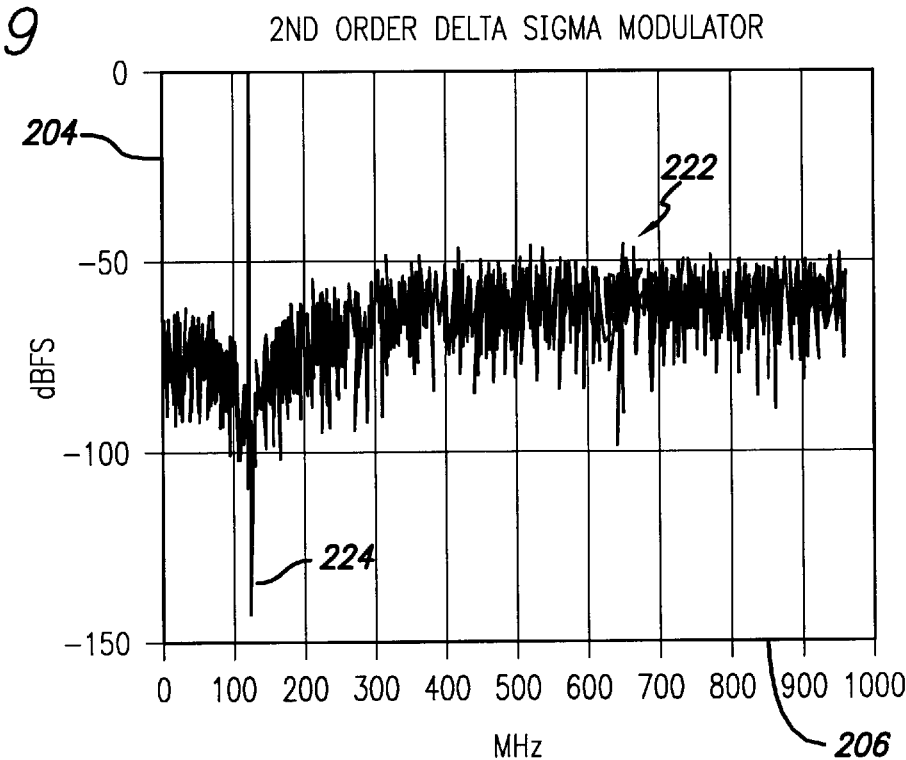
FIG. 9 is a graph of a simulated frequency response of the second order ΔΣ ADC of FIG. 3.

FIG. 9 is a graph 220 of a simulated frequency response 222 of the second order ΔΣ ADC 80 of FIG. 3, which is analogous to the frequency response 202 of FIG. 8. The graph 220 includes the horizontal axis 206 in MHz and the vertical axis 204 in decibels. The frequency response 222 includes a desirable low 224 at approximately 120 MHz and −140 dB. The graph 220 lacks a distinct peak and smoothly levels off between approximately −50 and −80 dB after approximately 300 MHz, which is the desired behavior. This indicates that the undesirable effects of excess delay in ΔΣ ADC feedback path 14 of FIG. 1 are compensated via the delay-compensated feedback path 84 of the ΔΣ ADC 80 of the present invention as illustrated in FIG. 3.

Thus, the present invention has been described herein with reference to a particular embodiment for a particular application. Those having ordinary skill in the art and access to the present teachings will recognize additional modifications, applications, and embodiments within the scope thereof.

It is therefore intended by the appended claims to cover any and all such applications, modifications and embodiments within the scope of the present invention.

Accordingly,

What is claimed is:

1. A high-performance analog-to-digital converter comprising:
    first means for converting an input analog signal to a digital output signal, said first means characterized by a transfer function that is altered relative to an ideal transfer function, said alteration being induced by excess loop delay in said first means, and
    second means for compensating for said excess loop delay.

2. The analog-to-digital converter of claim 1 wherein said alteration includes an additional pole and an additional zero included in said transfer function relative to said ideal transfer function.

3. The analog-to-digital converter of claim 2 wherein said alteration is induced by feedback delays in said first means.

4. The analog-to-digital converter of claim 3 wherein said feedback delays include signal dependent jitter delay and feedback digital-to-analog converter cell switching delays.

5. The analog-to-digital converter of claim 4 wherein said second means includes a latch for compensating for said signal dependent jitter delay.

6. The analog-to-digital converter of claim 1 wherein said analog-to-digital converter is a delta sigma modulator analog-to-digital converter.

7. The analog-to-digital converter of claim 6 wherein said first means includes a resonator and a quantizer.

8. The analog-to-digital converter of claim 7 wherein said second means includes a feedback path from an output of said quantizer to said resonator.

9. The analog-to-digital converter of claim 8 wherein said feedback path includes a first latch positioned between an output of said quantizer and said digital-to-analog converter.

10. The analog-to-digital converter of claim 9 wherein said feedback path includes an ad positioned at an output of said first latch, said additional latch for eliminating signal dependent jitter delay in said analog-to-digital converter.

11. The analog-to-digital converter of claim 9 wherein said digital-to-analog converter is a non-return-to-zero digital-to-analog converter.

12. The analog-to-digital converter of claim 9 wherein an output of said digital-to-analog converter is connected to said resonator.

13. A high-performance delta sigma analog-to-digital converter comprising:
    first means for filtering an analog input signal and providing a filtered signal in response thereto;
    second means for quantizing said filtered signal and providing a quantized digital output signal in response thereto, said quantized digital output signal provided via a feedback path to said first means; and
    third means for compensating for an increase in order of a transfer function of said delta sigma analog-to-digital converter due to delays in said feedback path.

14. The analog-to-digital converter of claim 13 wherein said analog-to-digital converter is a delta sigma modulator analog-to-digital converter.

15. The analog-to-digital converter of claim 14 wherein said first means includes a resonator stage and a feedback path.

16. The analog-to-digital converter of claim 15 wherein said quantized digital output signal is provided as an input to said resonator stage via said feedback path.

17. The analog-to-digital converter of claim 16 wherein said third means includes a first latch and a second latch, said first latch connected at an output of a quantizer included in said second means, said second latch connected at an output of said first latch, said second latch for eliminating undesirable delay effects due to signal dependent jitter in said delta sigma digital-to-analog converter.

18. The analog-to-digital converter of claim 17 wherein said quantizer includes a bank of comparators, and said first latch and said second latch are banks of latches that include a latch for each comparator of said bank of comparators in said quantizer.

19. The analog-to-digital converter of claim 18 wherein said third means further includes a digital-to-analog converter positioned connected at an output of said first latch and providing input to said resonator stage.

20. The analog-to-digital converter of claim 19 wherein said delta sigma analog-to-digital converter includes a plurality of resonator stages, and said digital-to-analog converter provides input to a last resonator stage of said delta sigma analog-to-digital converter.

21. The analog-to-digital converter of claim 20 wherein said analog-to-digital converter is $n^{th}$ order digital-to-analog converter having n feedback digital-to-analog converters, where n is a positive integer.

22. A high-performance analog-to-digital converter comprising:
    first means for filtering an analog input signal and providing a filtered signal in response thereto;
    second means for quantizing said filtered signal and providing a digital output signal in response thereto;
    third means for eliminating signal dependent jitter delay in said digital output signal and providing a jitter-free digital signal in response thereto; and fourth means for introducing an independent delay in said jitter-free signal and providing a delay compensated signal as feedback to said first means in response thereto.

23. A system for compensating for excess delay in a delta sigma modulator analog-to-digital converter comprising:

an output resonator stage and a corresponding feedback path and a digital-to-analog converter positioned in said feedback path of said output resonator stage of said delta sigma modulator analog-to-digital converter for compensating for an increase in order of a transfer function of said delta sigma modulator analog-to-digital converter due to excess delay.

24. The system of claim 23 further including a latch positioned at an output of a quantizer of said delta sigma modulator analog-to-digital converter for eliminating signal dependent jitter in a quantizer feedback path.

25. The system of claim 24 wherein said digital-to-analog converter is a non-return-to-zero digital-to-analog converter.

26. The system of claim 24 wherein said latch includes a bank of latches, one latch for each comparator of said quantizer.

27. A high-performance analog-to-digital converter comprising:

first means for filtering an analog input signal and providing a filtered signal in response thereto;

second means for comparing said analog signal to predetermined reference thresholds at predetermined time intervals and selecting reference thresholds to approximate said filtered signal and providing a digital signal in response thereto third means for aligning values of said digital signal; and fourth means for compensating for digital-to-analog converter cell switching delay of feedback digital-to-analog converters in said first means via an additional digital-to-analog converter positioned at an output of said third means.

28. The analog-to-digital converter of claim 27 wherein said first means includes a resonator.

29. The analog-to-digital converter of claim 27 wherein said second means includes a quantizer.

30. The analog-to-digital converter of claim 27 wherein said third means includes a quantizer-DAC feedback path.

31. A method for efficiently converting an electronic analog signal to a digital signal comprising:

converting an input analog signal to a digital output signal via a delta sigma modulator analog-to-digital converter, said delta sigma modulator analog-to-digital converter characterized by a transfer function having an additional pole and an additional zero relative to an ideal transfer funtion and compensating for said additional pole and said additional zero in said transfer function via an additional latch and an additional digital-to-analog converter.

* * * * *